(12) United States Patent
Shindo

(10) Patent No.: US 7,514,790 B2
(45) Date of Patent: Apr. 7, 2009

(54) SEMICONDUCTOR DEVICE AND METHOD OF MANUFACTURING A SEMICONDUCTOR DEVICE

(75) Inventor: Akinori Shindo, Kobucizawa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/402,324

(22) Filed: Apr. 11, 2006

(65) Prior Publication Data

US 2006/0273464 A1 Dec. 7, 2006

(30) Foreign Application Priority Data

Jun. 2, 2005 (JP) ............... 2005-162325

(51) Int. Cl.
*H01L 29/41* (2006.01)
(52) U.S. Cl. .................. 257/739; 257/784; 257/779
(58) Field of Classification Search ............. 257/739, 257/784, 779
See application file for complete search history.

(56) References Cited

U.S. PATENT DOCUMENTS

| 5,250,760 | A | | 10/1993 | Kano |
| 5,686,762 | A | * | 11/1997 | Langley .................... 257/775 |
| 5,804,883 | A | | 9/1998 | Kim et al. |
| 6,313,540 | B1 | * | 11/2001 | Kida et al. ................... 257/784 |
| 6,313,541 | B1 | * | 11/2001 | Chan et al. ................... 257/786 |
| 6,927,498 | B2 | * | 8/2005 | Huang et al. ................. 257/786 |
| 2003/0151149 | A1 | | 8/2003 | Ichikawa |

FOREIGN PATENT DOCUMENTS

| JP | 63-141330 | 6/1988 |
| JP | 63-161634 | 7/1988 |
| JP | 63-195729 | 12/1988 |
| JP | 04-002130 | 1/1992 |
| JP | 4-192333 | 7/1992 |
| JP | 05-226405 | 9/1993 |
| JP | 05226339 A * | 9/1993 |
| JP | 06-037135 | 2/1994 |
| JP | 09-036166 | 2/1997 |
| JP | 10-199923 | 7/1998 |
| JP | 11-297733 | 10/1999 |
| JP | 11-330121 | 11/1999 |
| JP | 2001-298041 | 10/2001 |
| JP | 2002-026064 | 1/2002 |
| JP | 2003-086620 | 3/2003 |

* cited by examiner

*Primary Examiner*—Leonardo Andújar
(74) *Attorney, Agent, or Firm*—Harness, Dickey & Pierce, P.L.C.

(57) ABSTRACT

A semiconductor device comprises: an insulation layer located on or above a semiconductor element; a conductive pad formed on the insulation film; and a first opening pattern formed on the conductive pad.

5 Claims, 10 Drawing Sheets (A)

(B)

(A)

(B)

(A)

(B)

(A)

(B)

SEMICONDUCTOR DEVICE AND METHOD OF MANUFACTURING A SEMICONDUCTOR DEVICE

The entire disclosure of Japanese Patent Application No. 2005-162325, filed Jun. 2, 2005 is expressly incorporated by reference herein.

BACKGROUND OF THE INVENTION

1. Technical Field

The present invention relates to a semiconductor device and a method of manufacturing a semiconductor device. In particular, the present invention relates to a semiconductor device and a method of manufacturing a semiconductor device in which a stress is constrained during wire bonding even if a conductive material flows from the central area of a conductive pad to a peripheral area.

2. Related Art

In order to downsize a semiconductor device, a technology for placing an electrode pad on an active surface where transistors are formed is under development. JPA2003-0866210 (see FIG. 1) is an example of the related art.

FIG. 14 is a cross section showing a conventional method of manufacturing a semiconductor device. The semiconductor device shown in this figure has a transistor formed on a silicon substrate 101. A first interlayer insulation film 108 is formed on a transistor and an element isolation film 102. Aluminum alloy wires 109a and 109b are formed on the first interlayer insulation layer 108. Each of aluminum alloy wires 109a and 109b is connected to each of impurity regions 107a and 107b respectively, which become source and drain regions of a transistor.

A second interlayer insulation layer 110 is formed on the first interlayer insulation film 108 and aluminum alloy wires 109a and 109b. An aluminum alloy pad 111 is formed on the second interlayer insulation layer 110. The end of the aluminum alloy pad 111 is above the transistor.

A passivation film 113 is formed on the second interlayer insulation layer 110 and the aluminum alloy pad 111. The passivation film 113 has an opening 113a located in the center of the aluminum alloy pad 111. A wire (not shown) is bonded to a part of the aluminum alloy pad 111 positioned in the opening 113a.

A power is occasionally given to the central area of the conductive pad when a wire is bonded to a conductive pad. In this case, a conductive material constituting a pad flows from the central area to peripheral area, generating a stress at the end of a pad. This stress occasionally causes cracks in a part of the interlayer insulation layer located under the end of a pad. Further, the stress has possibility of destroying elements such as transistors.

Further, the stress retains at the end of the pad when no crack is yielded, changing electrical characteristics of an element (a transistor for example) located under the end of a pad.

SUMMARY

In view of the above problem, the advantage of the present invention is to provide a semiconductor device and a method of manufacturing a semiconductor device in which the stress is constrained during wire bonding even if a conductive material flows from the central area of a conductive pad to a peripheral area.

According to a first aspect of the invention, a semiconductor device comprises: an insulation film located on or above a semiconductor element; a conductive pad formed on the insulation film; and a first opening pattern formed on the conductive pad.

According to the first aspect, the semiconductor device includes a first opening pattern formed on the conductive pad, making fluidity of a conductive material being absorbed by the first opening pattern even if the conductive material constituting a conductive pad flows. Hence, the stress generated around the peripheral of the conductive pad can be constrained. The conductive pad is composed of aluminum alloy for example.

If a plane of the conductive pad is about a polygon, the first opening pattern may be formed near each of the angle portions of the conductive pad. In this case, the first opening pattern may include a slit having an approximate L shape located along two sides constituting the angle portion. Otherwise, the first opening pattern may include a first slit extending from the central area of the conductive pad to the angle portions. In the latter case, the first opening pattern may further include a second slit extending along two sides constituting the angle portion.

If a plane of the conductive pad is about a circle or eclipse, the first opening pattern may include a plurality of slits formed along the edge of the conductive pad.

A second opening pattern may further be formed on about the center of the conductive pad. Further, a protective film may be formed on the insulation film and the peripheral of the conductive pad and a part of the protective film may be embedded into the first opening pattern. In such case, a flowed conductive material is blocked by the protection layer embedded in the first opening pattern.

According to a second aspect of the invention, a semiconductor device comprises: a first insulation layer located on or above a semiconductor element; a first conductive pad formed on the first insulation film; a first opening pattern formed on the peripheral of the first conductive pad; a second insulation film formed on the first insulation film and on the peripheral of the first conductive pad, including an opening portion on the first conductive pad; and a second conductive pad formed on the second insulation film and a part of the second conductive pad being embedded into the opening portion so as to be coupled to the first conductive pad. The semiconductor device may further include a second opening pattern formed on the second conductive pad.

According to third aspect of the invention, a semiconductor device comprises: a first insulation layer located on or above a semiconductor element; a first conductive pad formed on the first insulation film; a second insulation film formed on the first insulation film, including an opening portion on the first conductive pad; and a second conductive pad formed on the second insulation film and a part of the second conductive pad being embedded into the opening portion so as to be coupled to the first conductive pad; and a opening pattern formed on the second conductive pad and located in the opening portion.

According to fourth aspect of the invention, a method of semiconductor device comprises: forming an insulation film on or above a semiconductor element; forming a conductive film in an insulation film; and forming an opening pattern located on a conductive pad, which is above the semiconductor element, and within the conductive pad by patterning the conductive film. A process of bonding a wire to the conductive pad may be added after forming the conductive pad and the opening pattern.

BRIEF DESCRIPTION OF THE DRAWINGS

The invention will be described with reference to the accompanying drawings, wherein like numbers refer to like elements, and wherein.

DESCRIPTION OF EXEMPLARY EMBODIMENTS

Figure 1:
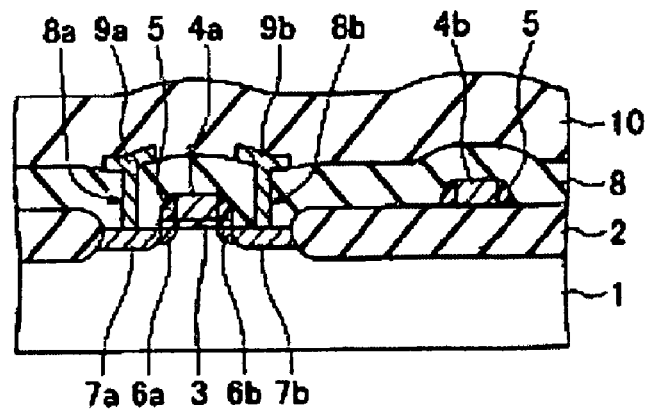
FIG. 1A is a cross section showing a method for manufacturing a semiconductor device according to a first embodiment.
FIG. 1B is a cross section of the other process following the process in FIG. 1A.
Figure 1:
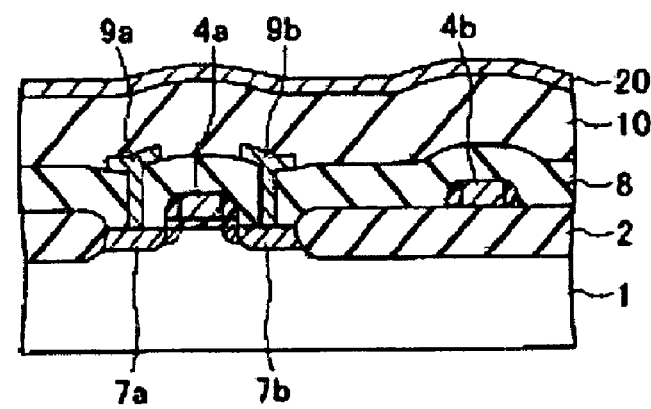
Figure 2:
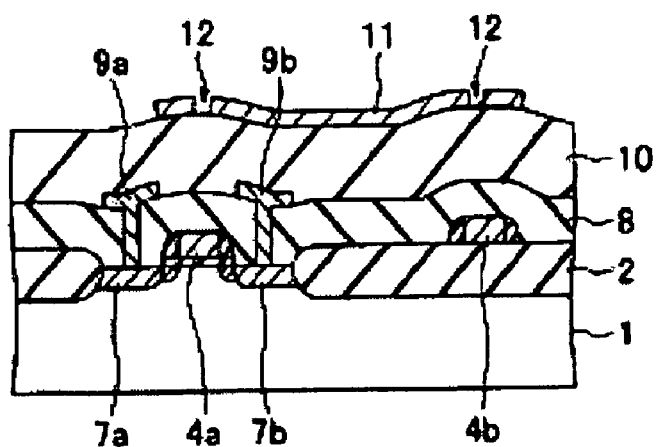
FIG. 2A is a cross section of the other process following the process in FIG. 1B.
FIG. 2B is a plane view under the process in FIG. 2A.
Figure 2:
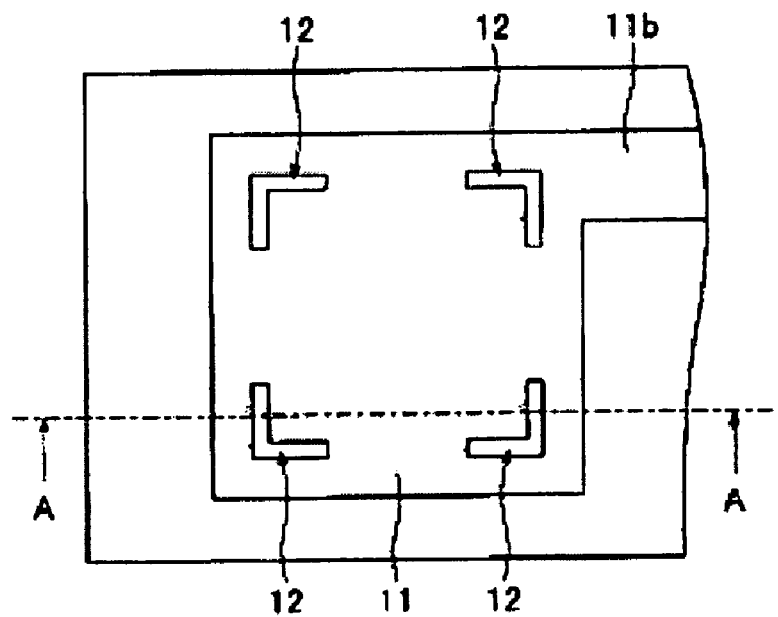
Figure 3:
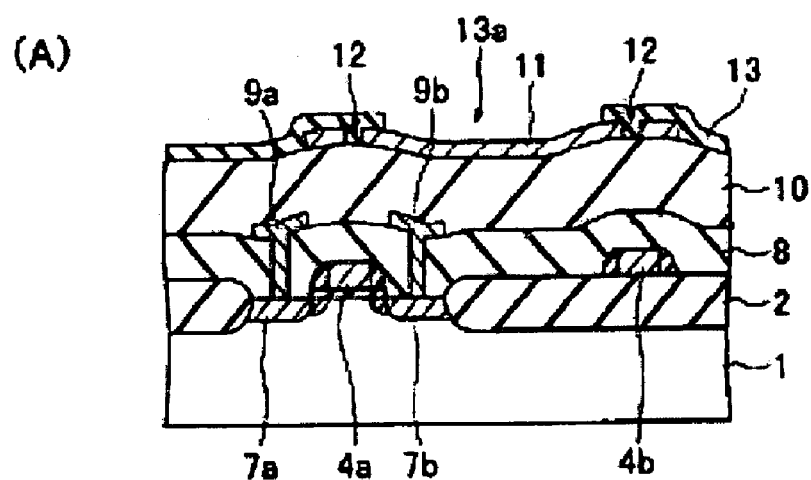
FIG. 3A is a cross section of the other process following the process in FIG. 2A.
FIG. 3B is a plane view under the process in FIG. 3A.
Figure 3:
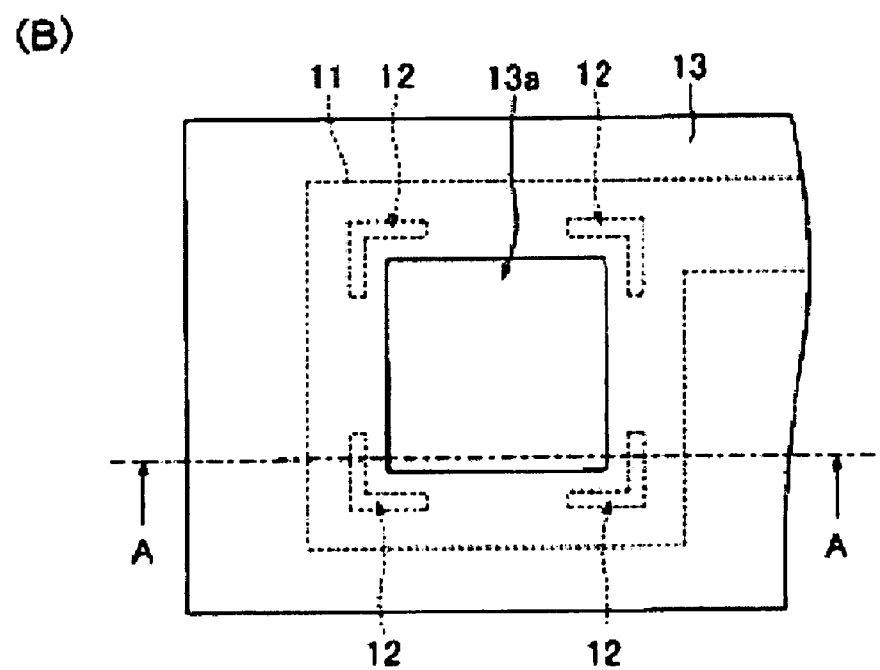

The embodiments of the invention are explained referring to figures. FIGS. 1A, 1B, 2A and 3A are cross sections showing a method for manufacturing a semiconductor device according to a first embodiment. FIGS. 2B and 3B are plane views of a semiconductor device under the process in FIG. 2A and FIG. 2B.

First, as shown in FIG. 1A, an element isolation film 2 is formed on a silicon substrate 1 to separate an element region for a transistor from other regions. The element isolation film 2 may be formed by a LOCOS oxidization method or embedded into the silicon substrate 1 by a trench isolation method.

Next, the silicon substrate 1 is thermally oxidized. This oxidizing forms a gate oxidization film 3 on the substrate 1 located in the element region. Then, a poly crystalline silicon film is formed on the gate oxidization film 3 and the element isolation film 2 and patterned. This patterned film is a gate electrode 4a formed on the gate oxidization film 3 and a polycrystalline resistance 4b formed on the element isolation film 2. Further, impurities are implanted to the silicon substrate 1, which is masked by the gate electrode 4a and the element isolation film 2. This implanting impurities forms low density impurity regions 6a and 6b of a transistor.

Next, an oxide silicon film is formed on the entire surface including the gate electrode 4a and etched back. This etched oxide silicon film covers over side walls of the gate electrode 4a and the poly silicon resistance 4b as a side wall 5. Then, impurities are implanted to the silicon substrate 1, which is masked by the gate electrode 4a, the side wall 5 and the element isolation film 2 as a mask. This implanting impurities forms impurity regions 7a and 7b to be a drain region of a transistor. Accordingly, a transistor is formed in the element region of the silicon substrate 1 thereby.

Next, a first interlayer insulation film 8 mainly composed of oxide silicon is formed on the entire surface of a transistor. The first interlayer insulation film 8 includes a first layer formed by a CVD method, a second layer as a SOG layer and a third layer formed by a CVD method. The surface of the second layer is etched back. Forming the second layer improves the surface flatness of the first interlayer insulation film 8.

Next, a photo resist film (not shown in the figure) is coated on the first interlayer insulation layer 8, exposed to light and developed. This process forms a resist pattern on the first interlayer insulation layer 8. Then, the first interlayer insulation layer 8 is etched while being masked by the resist pattern. This etching forms contact holes 8a and 8b located on impurity regions 7a and 7b respectively in the first interlayer insulation layer 8. Then, the resist pattern is removed.

Next, an aluminum alloy film is deposited within these contact holes 8a and 8b and on the first interlayer insulation film 8 by sputtering. Then, a photo resist film (not shown in the figure) is coated on the aluminum alloy film, exposed to light and developed. This process forms a resist pattern on the aluminum alloy film. Then, the aluminum alloy film is etched while being masked by the resist pattern. This etching forms aluminum alloy wires 9a and 9b on the first interlayer insulation layer 8. The aluminum alloy wire 9a is connected to the impurity region 7a via the contact hole 8a and the aluminum alloy wire 9b is connected to the impurity region 7b via the contact hole 8b. Then, the resist pattern is removed.

Then, the second interlayer insulation layer 10 is formed on the first interlayer insulation film 8 and aluminum alloy wires 9a and 9b. The structure of the second interlayer insulation layer 10 and the method of manufacturing it are the same of the first interlayer insulation layer 8 and the method of manufacturing it. Then, a photo resist film (not shown in the figure) is coated on the second interlayer insulation layer 10, exposed to light and developed. This process forms a resist pattern on the second interlayer insulation layer 10. Further, the second interlayer insulation layer 10 is etched while being masked by the resist pattern. This etching forms a contact hole (not shown in the figure) on the second interlayer insulation layer 10. Then, the resist pattern is removed.

Next, as shown in FIG. 1B, an aluminum alloy film is deposited within these contact holes not shown in the figure and on the second interlayer insulation film 10 by sputtering.

Further, as shown in FIGS. 2A and 2B, a photo resist film (not shown in the figure) is coated on the aluminum alloy film, exposed to light and developed. This process forms a resist pattern on the aluminum alloy film. Then, the aluminum alloy film is etched while being masked by the resist pattern. This etching forms the aluminum alloy pad 11 and the aluminum alloy wire 11b on the second interlayer insulation film 10. A part of the aluminum alloy wire 11b is embedded into the contact hole. Then, the resist pattern is removed.

The aluminum alloy pad 11 is nearly a square as shown in FIG. 2B, and connected to the aluminum alloy wire 11b. One of angle portions in the aluminum alloy pad 11 is placed above a transistor and others are placed above the poly silicon resistance 4b. Opening patterns 12 having slits are formed at four angle portions of the aluminum alloy pad 11. Each of opening patterns 12 has the shape of a letter L and is placed along the two sides forming angle portion.

Next, as shown in FIGS. 3A and 3B, the passivation film 13 is formed on the second interlayer insulation film 10, the aluminum pad 11 and the aluminum alloy wiring 11b by a CVD method. In the film 13, an oxide silicon film and a nitride silicon film are deposited in this order. Then, a photo resist film is coated on the passivation film 13, exposed to light and developed. This process forms a resist pattern on the passivation film 13. Further, the passivation film 13 is etched while being masked by the resist pattern. This etching forms the opening portion 13a located on the aluminum alloy pad 11 within the passivation film 13. The inside of the opening portion 13a. doesn't include opening patterns 12. The passivation film 13 is embedded into insides of these opening patterns 12.

Next, a wire (not shown) is connected to the aluminum alloy pad 11 positioned in the opening portion 13a. Here, when connecting the wire, a power is applied to the aluminum alloy pad 11 positioned in the opening portion 13a, making this aluminum alloy flow to a spherical area. The flowed aluminum alloy directs to four angle portions of the aluminum alloy pad 11. However, a part of the flowed aluminum alloy is blocked by the opening pattern 12 since the passivation film 13 is embedded in the inside of the angle portion of the opening pattern 12. Accordingly, concentrating aluminum alloy to the angle portion can be constrained comparing to the conventional method.

Hence, in the present embodiment, the stress generated at the angle portion of the aluminum alloy pad 11 becomes small comparing to the conventional method. Accordingly, the crack in the second interlayer insulation film 10 can be avoided. Further, a transistor and the poly silicon resistance 4b located under the aluminum pad 11 are prevented from breaking down. Further, the method of the embodiment constrains the change of the characteristics of a transistor and the poly silicon resistance 4b due to the stress.

Figure 4:
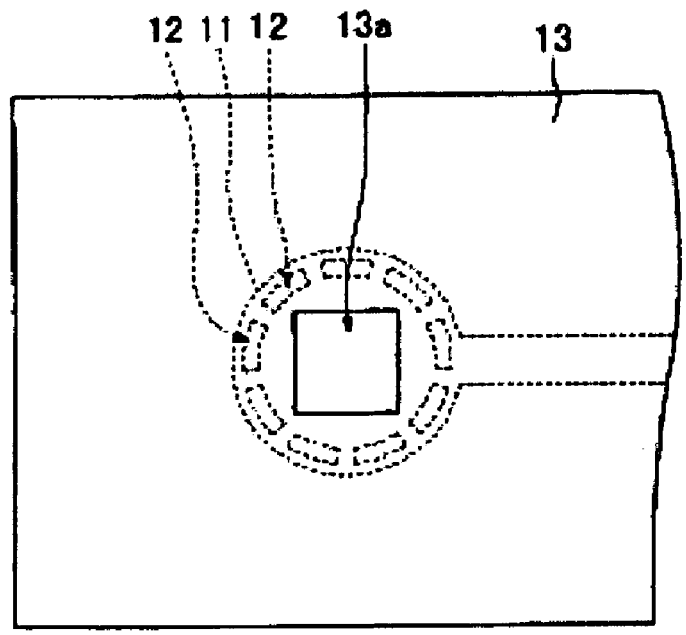
FIG. 4 is a plane view showing a semiconductor device according to a second embodiment.

FIG. 4 is a plane view showing the structure of a semiconductor device of a second embodiment of the invention and corresponds to FIG. 3B in the first embodiment. This semiconductor device has the same structure of the semiconductor device manufactured by the method shown in FIG. 1 except the configuration of the aluminum pad 11. Further, a method of manufacturing the semiconductor device in this figure is the same method of manufacturing the semiconductor device in the first embodiment. The same reference numerals are applied to the same structural elements in the first embodiment and these explanations are omitted.

The aluminum alloy pad 11 is nearly a circle in the embodiment. The opening pattern 12 has a plurality of slits. These slits are positioned along the edge of the aluminum alloy pad 11. The opening portion 13a is formed in the passivation film 13 located above the aluminum alloy 11 and the passivation film 13 is embedded in the opening pattern 12. Here, a transistor and a poly silicon resistance (not shown) disclosed in the first embodiment are placed under the peripheral of the aluminum alloy pad 11.

In the embodiment, when a wire (not shown) is bonded to the aluminum alloy pad 11 located within the opening portion 13a, aluminum alloy constituting the aluminum alloy pad 11 flows toward the peripheral as the same in the first embodiment. However, concentrating aluminum alloy into the spherical area can be constrained as the same of the first embodiment since the passivation film 13 is embedded into the inside of the opening pattern 12 located in the peripheral of the aluminum pad 11. Accordingly, the present embodiment attains the same effect of the first embodiment.

Figure 5:
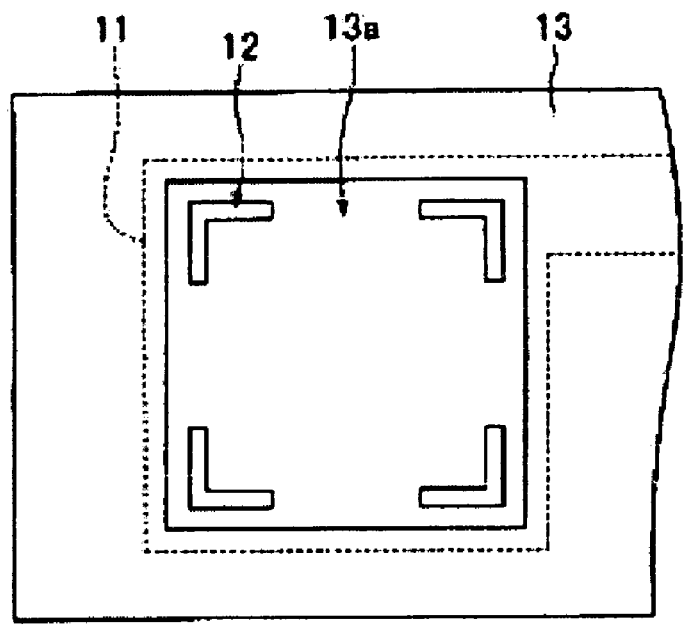
FIG. 5 is a plane view showing a semiconductor device according to a third embodiment.

FIG. 5 is a plane view showing a structure of a semiconductor device of a third embodiment of the invention and corresponds to FIG. 3B in the first embodiment. The semiconductor device in the figure is the same in the first embodiment except that the opening pattern 12 is placed within the opening portion 13a installed in the passivation film 13. Hence, the passivation film 13 is not embedded into the inside of the opening pattern 12. Here, the method of manufacturing a semiconductor device in this figure is the same method of manufacturing a semiconductor device of the first embodiment.

In the embodiment, when a wire (not shown) is connected to the aluminum alloy pad 11 located in the opening portion 13a by a wire bonding method, aluminum alloy constituting the aluminum pad 11 flows toward the angle portion of the aluminum pad 11 as the same of the first embodiment. But, the fluidity of aluminum is absorbed by the deformation of the opening pattern 12.

Hence, according to the embodiment, concentrating flowed aluminum alloy into the angle portion of the aluminum alloy pad 11 can be constrained. Accordingly, the present embodiment attains the same effect of the first embodiment.

Figure 6:
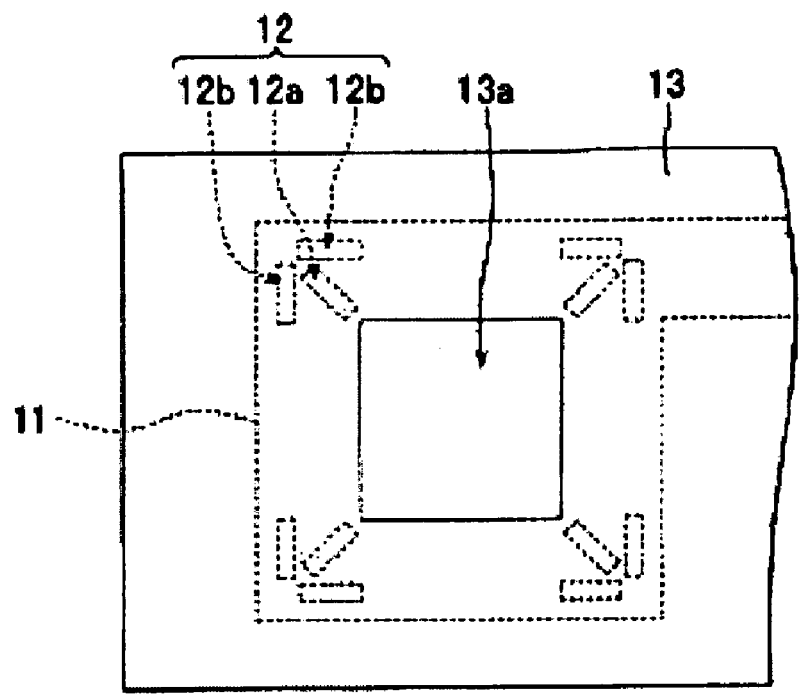
FIG. 6 is a plane view showing a semiconductor device according to a fourth embodiment.

FIG. 6 is a plane view showing the structure of a semiconductor device of a fourth embodiment of the invention and corresponds to FIG. 3B in the first embodiment. The semiconductor device in the figure has the same structure of the semiconductor device manufactured by the method shown in FIG. 1 except the configuration of the aluminum pad 11 formed in the angle portion of the aluminum pad 11. Further, a method of manufacturing the semiconductor device in this figure is the same method of manufacturing the semiconductor device in the first embodiment. The same reference numerals are applied to the same structural elements in the first embodiment and these explanations are omitted.

In the embodiment, the opening pattern 12 includes the slit 12a extending toward the center area from the angle portion of the aluminum pad 11 and the two slits 12b placed in parallel with two sides constituting the angle portion. The edges at the angle portion side of the aluminum pad 11 among edges of slits 12a and 12b are adjacent each other. The present embodiment has the same effect and function of the first embodiment.

Figure 7:
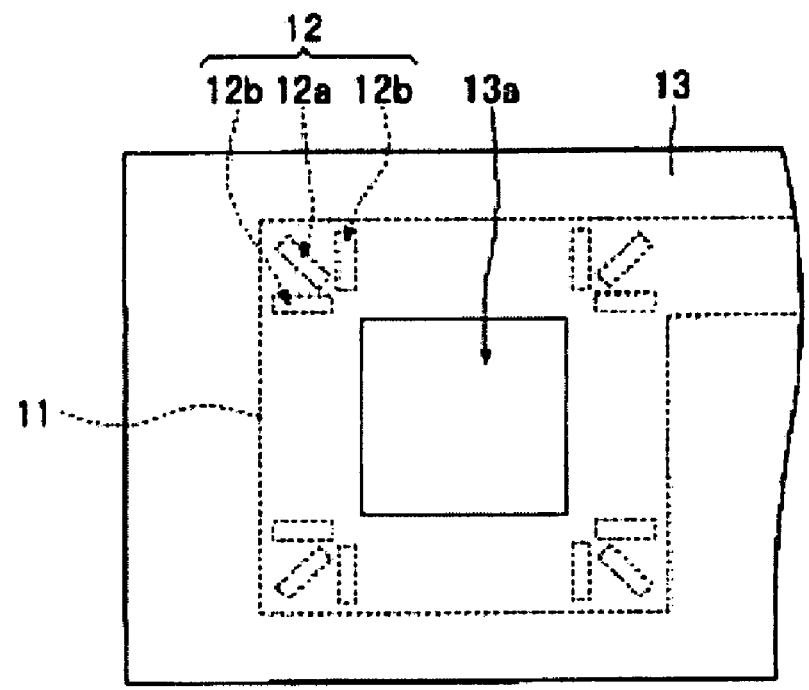
FIG. 7 is a plane view showing a semiconductor device according to a fifth embodiment.

FIG. 7 is a plane view showing the structure of a semiconductor device of a fifth embodiment of the invention and corresponds to FIG. 3B in the first embodiment, The semiconductor device in the figure has the same structure of the fourth embodiment except the configuration of the aluminum pad 11 formed in the angle portion of the aluminum pad 11. Further, a method of manufacturing the semiconductor device in this figure is the same method of manufacturing the semiconductor device in the fourth embodiment. The same reference numerals are applied to the same structural elements in the fourth embodiment and these explanations are omitted.

In the embodiment, the slits 12a and 12b in the opening pattern 12 have edges at the center side of aluminum alloy pad 11 which are adjacent each other. The present embodiment has the same effect and function of the fourth embodiment.

Figure 8:
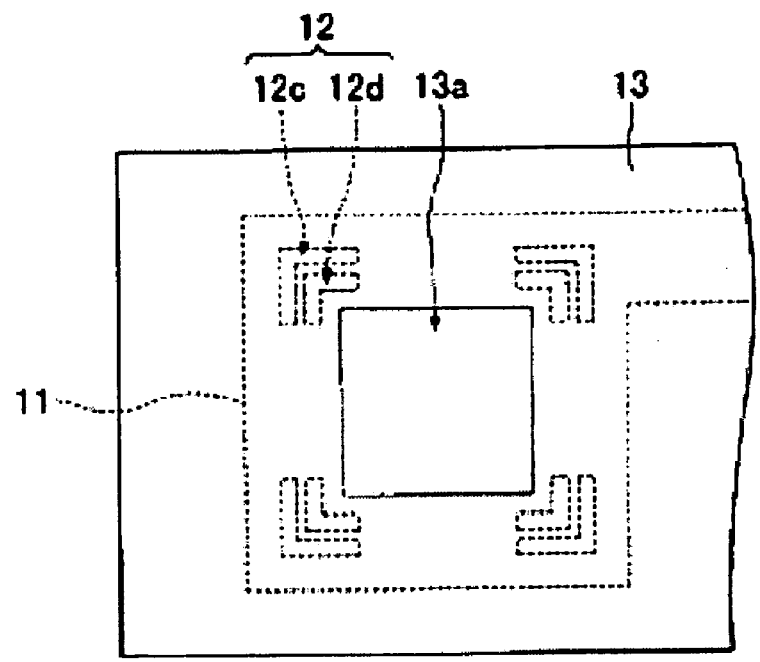
FIG. 8 is a plane view showing a semiconductor device according to a sixth embodiment.

FIG. 8 is a plane view showing the structure of a semiconductor device of a sixth embodiment of the invention and corresponds to FIG. 3B in the first embodiment, The semiconductor device in the figure has the same structure of the semiconductor device of the first embodiment except that the multiple opening patterns 12 having nearly a L shape are formed at the angle portion of the aluminum pad 11. The opening pattern 12 located inside is smaller the opening patterns 12 located outside. Further, a method of manufacturing the semiconductor device in this figure is the same method of manufacturing the semiconductor device in the first embodiment. The same reference numerals are applied to the same structural elements in the first embodiment and these explanations are omitted. The present embodiment has the same effect and function of the first embodiment.

Figure 9:
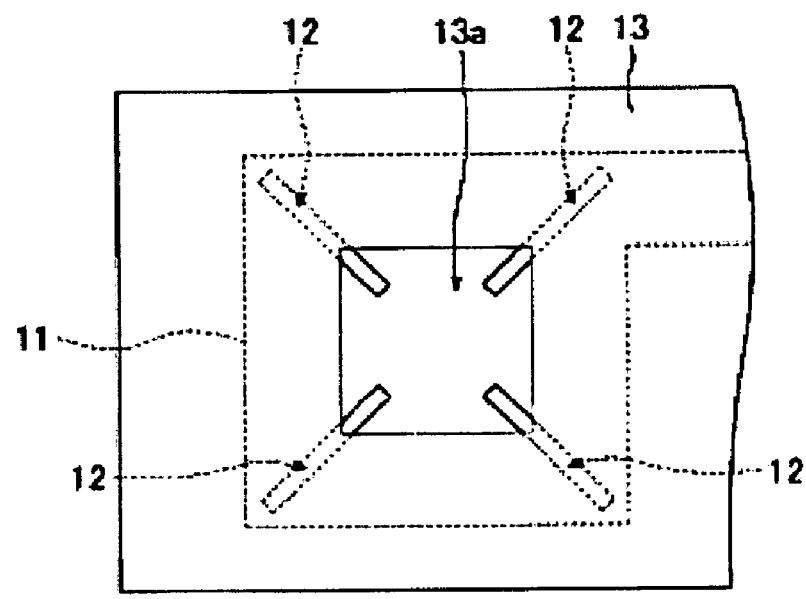
FIG. 9 is a plane view showing a semiconductor device according to a seventh embodiment.

FIG. 9 is a plane view showing the structure of a semiconductor device of a seventh embodiment of the invention and corresponds to FIG. 3B in the first embodiment. The semiconductor device in the figure has the same structure of the semiconductor device of the first embodiment except the configuration of the aluminum pad 11 formed in the angle portion of the aluminum pad 11. Further, a method of manufacturing the semiconductor device in this figure is the same method of manufacturing the semiconductor device in the first embodiment. The same reference numerals are applied to the same structural elements in the first embodiment and these explanations are omitted.

In the embodiment, the opening pattern 12 has a slit shape and extends toward the center of the aluminum alloy pad 11 from the four angel portions of the aluminum alloy pad 11. In the opening pattern 12, the passivation film 13 is embedded into the inside of the angle portion, but the center is exposed at the inside of the opening portion 13*a*.

In the embodiment, when a wire (not shown) is bonded to the aluminum alloy pad 11 located in the opening portion 13*a*, aluminum alloy constituting the aluminum pad 11 flows toward the angle portion of the aluminum alloy pad 11 as the same of the first embodiment. But, the fluidity of aluminum is absorbed by the deformation of the opening pattern 12 exposed in the opening portion 13*a*. Flowed aluminum alloy is blocked by the passivation film 13 embedded in the inside of the opening pattern 12 located in the angle portion. Accordingly, the present embodiment attains the same effect of the first embodiment.

Figure 10:
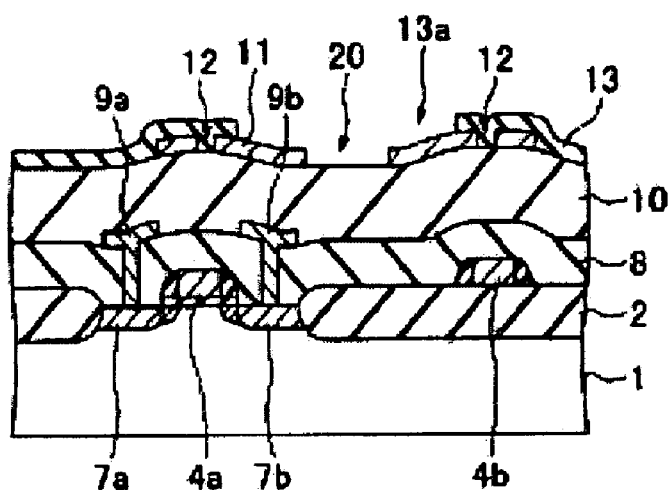
FIG. 10A is a cross section of showing a semiconductor device according to a eighth embodiment.
FIG. 10B is a plane view of the semiconductor device in FIG. 10A.
Figure 10:
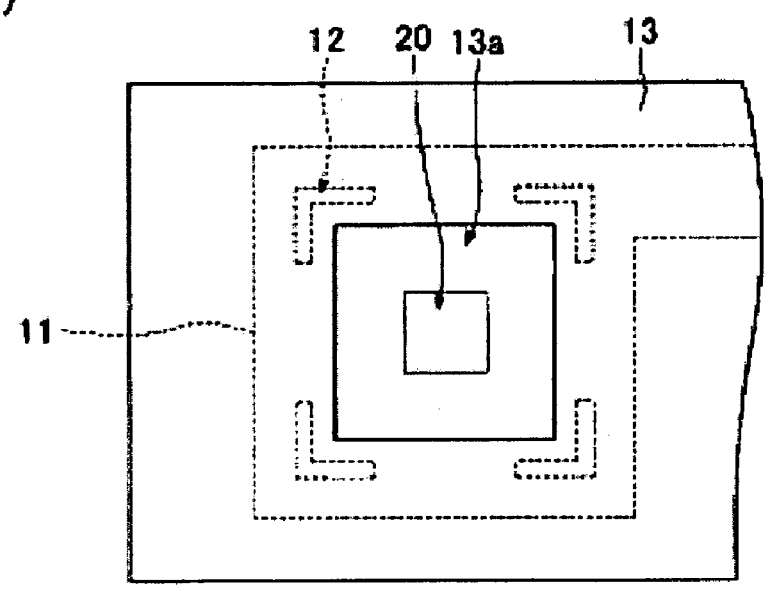

FIG. 10A is a cross section of showing a semiconductor device according to a eighth embodiment. FIG. 10B is a plane view of the semiconductor device in FIG. 10A. This figure corresponds to FIG. 3 in the first embodiment. The semiconductor device in the figure has the same structure of the semiconductor device of the first embodiment except that a opening portion 20 is formed in the center of aluminum pad 11. Further, a method of manufacturing the semiconductor device in this figure is the same method of manufacturing the semiconductor device in the first embodiment. The same reference numerals are applied to the same structural elements in the first embodiment and these explanations are omitted.

Hence, in the semiconductor device, the stress generated at the angle portion of the aluminum alloy pad 11 becomes small comparing to the conventional method. Further, the opening portion 20 is formed in the center of aluminum pad 11, reducing an amount of aluminum alloy flowing at wire bonding. Hence, the stress generated at the angle portion of the aluminum alloy pad 11 further becomes small.

Accordingly, the crack in the second interlayer insulation film 10 can be avoided. Further, a transistor and the poly silicon resistance 4*b* located under the aluminum pad 11 are prevented from breaking down. Further, the structure of the embodiment constrains the change of the characteristics of a transistor and the poly silicon resistance 4*b* due to the stress.

Figure 11:
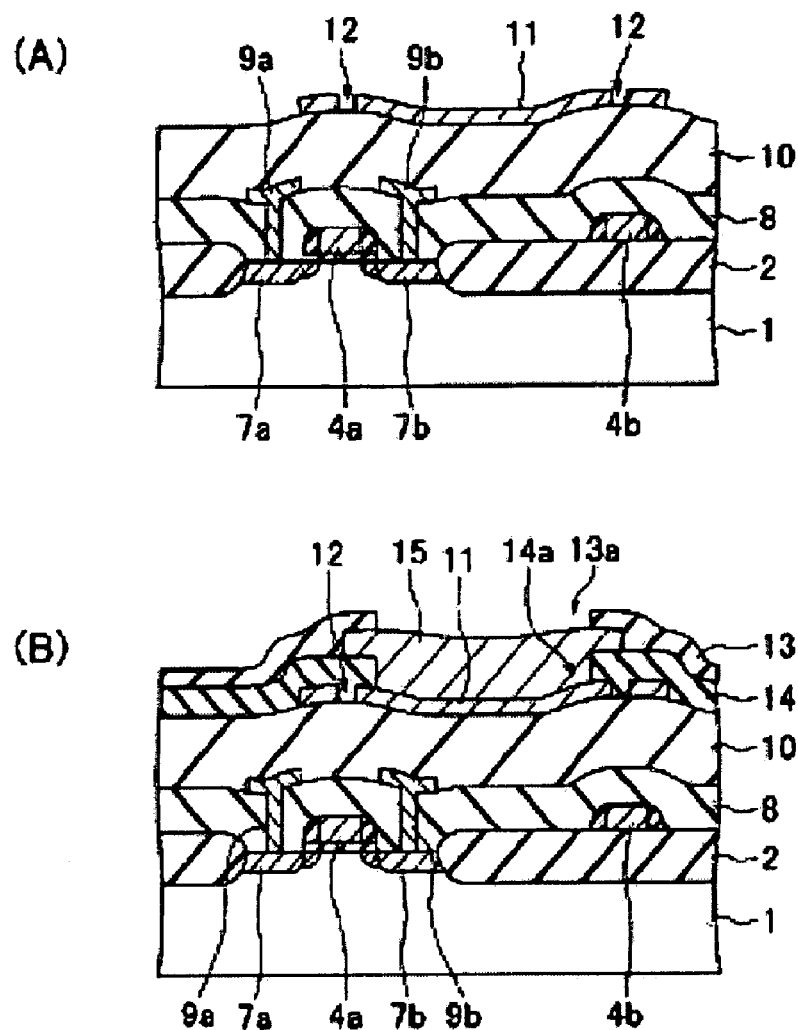
FIG. 11A is a cross section of showing a method of manufacturing a semiconductor device according to a ninth embodiment.
FIG. 11B is a cross section showing the other process following the process in FIG. 11B.

FIG. 11 is a cross section of showing a method for manufacturing a semiconductor device according to a ninth embodiment. In the semiconductor device of the embodiment, an aluminum alloy pad has double layers. The same reference numerals are applied to the same structural elements in the first embodiment and these explanations are omitted.

First, an element isolation layer 2 is formed on a silicon substrate 1 as shown in FIG. 11A. Next, a gate oxide layer 3, a gate electrode 4*a*, a poly silicon resistance 4*b*, a sidewall 5, low density impurity regions 6*a* and 6*b*, impurity regions 7*a* and 7*b*, a first interlayer insulating film 8, a contact hole 8*a* and 8*b*, aluminum alloy wirings 9*a* and 9*b*, a second interlayer insulation film 10 and aluminum alloy pad 11 are formed. The opening pattern 12 is formed in the aluminum alloy pad 11. A method of manufacturing these elements are the same in the first embodiment.

Next, as shown in FIG. 11B, a third interlayer insulation film 14 is formed on the second interlayer insulation film 10 and aluminum alloy pad 11. At this time, the third interlayer insulation film 14 is embedded into the inside of the opening pattern 12. The structure of the third interlayer insulation layer 14 and the method of manufacturing it are the same of the first interlayer insulation layer 8 and the method of manufacturing it.

Then, a photo resist film (not shown in the figure) is coated on the third interlayer insulation layer 14, exposed to light and developed. This process forms a resist pattern on the third interlayer insulation layer 14. Further, the third interlayer insulation layer 14 is etched while being masked by the resist pattern. This etching forms an opening portion 14*a* located on the aluminum alloy pad 11 within the third interlayer insulation film 14. The opening pattern 12 located at the angle portion of the aluminum pad 11 remains to be covered by the third interlayer insulation film 14.

Further, on the third interlayer insulation film 14 and within the opening portion 14*a*, an aluminum alloy film is formed by a sputtering method. Then, a photo resist film (not shown in the figure) is coated on the aluminum alloy film, exposed to light and developed. This process forms a resist pattern on the aluminum alloy film. Then, the aluminum alloy film is etched while being masked by the resist pattern. This etching forms a second aluminum alloy pad 15 on the third interlayer insulation layer 14. The lower part of the second aluminum alloy pad 15 is embedded into the opening portion 14*a*, being connected to the aluminum alloy pad 11.

Further, the passivation film 13 is formed on the third interlayer insulation film 14 and the second aluminum alloy pad 15 and the opening portion 13*a* is formed on the second aluminum alloy pad 15. A method of manufacturing these elements are the same in the first embodiment.

Next, a wire (not shown) is bonded to the second aluminum alloy pad 15 positioned in the opening portion 13*a*. At this time, a power is given to the aluminum alloy pad 11, making aluminum alloy constituting the aluminum alloy pad 11 flow toward the four angle portions. However, a part of the flowed aluminum alloy is blocked by the opening pattern 12 since the passivation film 13 is embedded in the inside of the angle portion of the opening pattern 12. Accordingly, concentrating aluminum alloy to the angle portion of the aluminum alloy pad 11 can be constrained comparing to the conventional method.

Hence, in the present embodiment, the stress generated at the angle portion of the aluminum alloy pad 11 becomes small comparing to the conventional method. The present embodiment has the same effect of the first embodiment. Further, exposing the second interlayer insulation film 10 to the atmosphere can be constrained by the embodiment, preventing the humidity resistance of a semiconductor device from being lowered.

Figure 12:
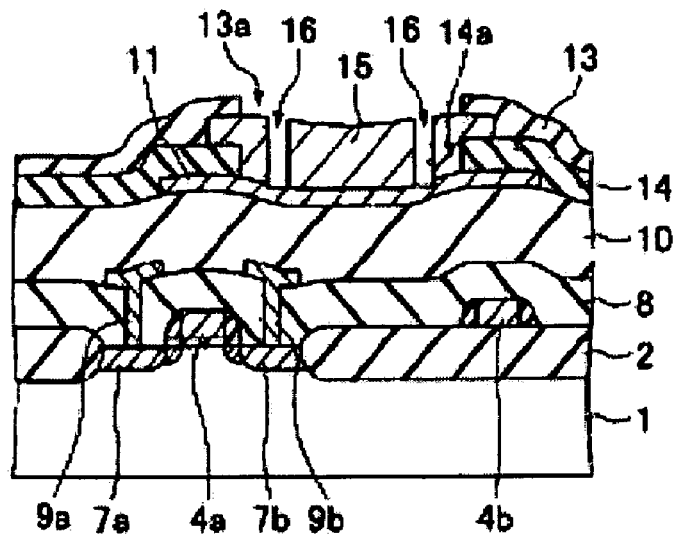
FIG. 12 is a cross section showing a semiconductor device according to a tenth embodiment.

FIG. 12 is a cross section showing a semiconductor device according to a tenth embodiment. A semiconductor device of the embodiment has the same structure in the ninth embodiment except that the opening pattern 12 is not formed in the aluminum alloy pad 11 and an opening pattern 16 is formed in the second aluminum alloy pad 15. Further, a method of manufacturing the semiconductor device in this figure is the same method of manufacturing the semiconductor device in the ninth embodiment. The opening pattern 16 is formed by pattering the second aluminum alloy pad 15. The same reference numerals are applied to the same structural elements in the ninth embodiment and these explanations are omitted.

The opening pattern 16 has nearly a letter L shape and almost the same plane shape in the ninth embodiment. However, the opening pattern 16 is located within the opening portion 13a of the passivation film 13 and the inside of the opening portion 14a of the third interlayer insulation film 14.

According to the embodiment, even when aluminum alloy constituting the second aluminum alloy pad 15 flows, such fluidity is absorbed by the opening pattern 16. Accordingly, the present embodiment attains the same effect of the first embodiment.

Figure 13:
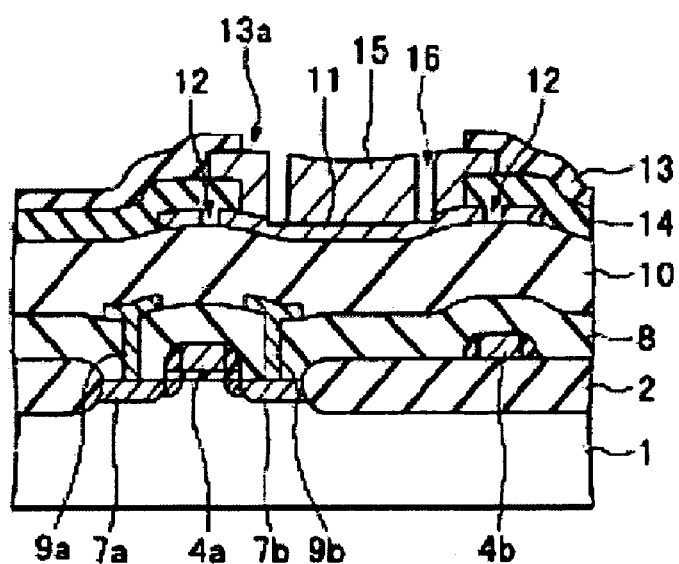
FIG. 13 is a cross section showing a semiconductor device according to a eleventh embodiment.
Figure 14:
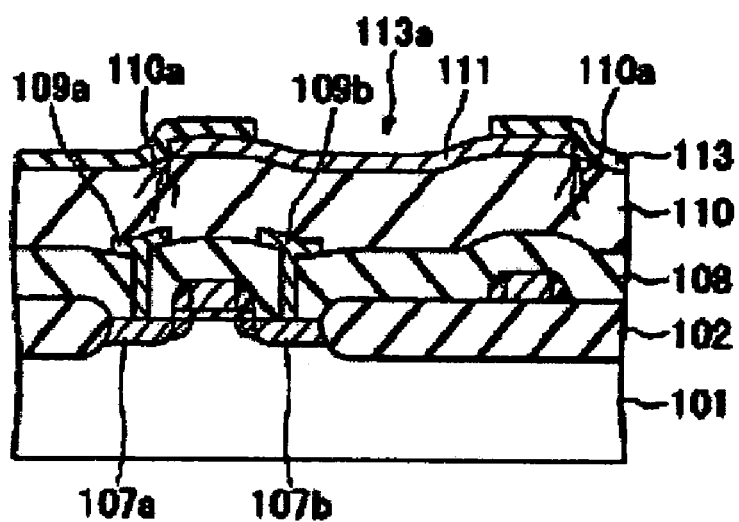
FIG. 14 is a cross section showing a conventional semiconductor device

FIG. 13 is a cross section showing a semiconductor device according to an eleventh embodiment. The semiconductor device in the figure has the same structure of the semiconductor device of the tenth embodiment except that the opening pattern 12 is formed in the aluminum alloy pad 11. Further, a method of manufacturing the semiconductor device in this figure is the same method of manufacturing the semiconductor device in the tenth embodiment. The same reference numerals are applied to the same structural elements in the ninth embodiment and these explanations are omitted.

The present embodiment attains effects and functions shown in both the ninth embodiment and tenth embodiment. Accordingly, the present embodiment attains the same effect of the first embodiment.

The present invention is not limited to the above-mentioned embodiments and can be applied to various modifications within a spirit of the invention. In these embodiments described above, at the plurality of circular or polygon opening portions, opening patterns may be formed as slits, for example. Further, the plurality of circular or polygon opening portions may be formed as a matrix on a entire aluminum alloy pad 11 or the circumferential area.

Further, in the ninth to eleventh embodiments, a plurality of contact holes located on the aluminum alloy pad 11 may be formed in the third interlayer insulation film 14 instead of the opening area 14a in the third interlayer insulation film 14. In this case, tungsten plugs may be embedded into a plurality of contact holes.

Further, in these embodiments described above, when a bump is formed on the aluminum alloy pad without bonding a wire to the aluminum alloy pad, aluminum alloy constituting the aluminum alloy pad flows toward the peripheral area with a pressure if pressing a bump to other substrate. However, even in this case, the stress generated in the angle portion and the peripheral of the aluminum alloy pad becomes small comparing to the conventional because of the same effect and function in these embodiments described above. Accordingly, this case has the same effect of these embodiments described above.

What is claimed is:

1. A semiconductor device, comprising:
a first insulation film located on or above a semiconductor element;
a first conductive pad formed on the first insulating film, the first conductive pad including a first opening pattern in a periphery of the first conductive pad and on a first region of the first insulation layer;
a second insulation film formed on the first insulation film and on the first conductive pad, the second insulation film including an opening portion on the first conductive pad, a part of the second insulation film being embedded into the first opening pattern and contacting the first region of the first insulation layer; and
a second conductive pad formed on the second insulation film, the second conductive pad being embedded into the opening portion to be coupled to the first conductive pad.

2. A semiconductor device according to claim 1, further comprising a second opening pattern formed on the second conductive pad.

3. A semiconductor device comprising:
an insulating film located on or above a semiconductor element;
a conductive pad formed on the insulation film, the conductive pad including a first opening pattern on the insulation layer; and
a protective film formed on the insulation layer and the conductive pad, a part of the protective film being embedded into the first opening pattern and contracting a first region of the insulation layer through the first opening pattern, the first region of the insulating layer overlapping with the first opening pattern,
wherein the semiconductor element includes a transistor, and the conductive pad is formed above the transistor.

4. A semiconductor device comprising:
an insulation film located on or above a semiconductor element;
a conductive pad formed on the insulation film, the conductive pad including a first opening pattern on the insulation layer; and
a protective film formed on the insulation layer and the conductive pad, a part of the protective film being embedded into the first opening pattern and contacting a first region of the insulation layer through the first opening pattern, the first region of the insulating layer overlapping with the first opening pattern,
wherein the semiconductor element includes a transistor, and the conductive pad is nearly a polygon, one of angle portions of the conductive pad being placed above the transistor.

5. A semiconductor device, comprising:
a first insulation film located on or above a semiconductor element;
a first conductive pad formed on the first insulating film, the first conductive pad including a first opening pattern in a periphery of the first conductive pad and on a first region of the first insulation film;
a second insulation film formed on the first insulation film and on the first conductive pad, the second insulation film including an opening portion on the first conductive pad, a part of the second insulation film being embedded into the first opening pattern and contacting the first region of the first insulation layer; and
a second conductive pad formed on the second insulation film, the second conductive pad being embedded into the opening portion, the second conductive pad being coupled to the first conductive pad.

* * * * *